US010424608B1

(12) United States Patent
DeLyon et al.

(10) Patent No.: US 10,424,608 B1
(45) Date of Patent: Sep. 24, 2019

(54) FABRICATION OF POLYCRYSTALLINE SEMICONDUCTOR INFRARED DETECTOR

(71) Applicant: HRL Laboratories, LLC, Malibu, CA (US)

(72) Inventors: Terence J. DeLyon, Newbury Park, CA (US); Rajesh D. Rajavel, Oak Park, CA (US); Sevag Terterian, Lake Balboa, CA (US); Minh B. Nguyen, Thousand Oaks, CA (US); Hasan Sharifi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/885,708

(22) Filed: Jan. 31, 2018

(51) Int. Cl.
H01L 31/00 (2006.01)
H01L 27/144 (2006.01)
H01L 31/02 (2006.01)
H01L 31/18 (2006.01)
H01L 31/0368 (2006.01)
H01L 31/109 (2006.01)
H01L 31/0304 (2006.01)

(52) U.S. Cl.
CPC ...... H01L 27/1443 (2013.01); H01L 27/1446 (2013.01); H01L 31/02019 (2013.01); H01L 31/03046 (2013.01); H01L 31/0368 (2013.01); H01L 31/109 (2013.01); H01L 31/1844 (2013.01); H01L 31/1868 (2013.01)

(58) Field of Classification Search
None
See application file for complete search history.

(56) References Cited

U.S. PATENT DOCUMENTS

| 5,045,907 | A | 9/1991 | Solomon |
| 6,194,722 | B1 | 2/2001 | Fiorini et al. |
| 7,718,965 | B1 | 5/2010 | Syllaios et al. |
| 2001/0055833 | A1 | 12/2001 | Fiorini et al. |
| 2006/0162768 | A1* | 7/2006 | Wanlass ............ H01L 31/06875 136/262 |
| 2012/0145996 | A1* | 6/2012 | Ting ............ B82Y 20/00 257/21 |
| 2015/0295108 | A1* | 10/2015 | Wei ............ H01L 31/035236 257/21 |
| 2016/0290865 | A1* | 10/2016 | Delaunay ............ H01L 31/0304 |

OTHER PUBLICATIONS

Scheller, L. P., et al., Hydrogen passivation of polycrystalline silicon thin films, Journal of Applied Physics, 2012, pp. 063711-1-063711-8, 112, Published by American Institute of Physics 2012 copyright.

(Continued)

Primary Examiner — Ali Naraghi
(74) Attorney, Agent, or Firm — North Shore Associates

(57) ABSTRACT

Methods of fabrication and monolithic integration of a polycrystalline infrared detector structure deposit Group III-V compound semiconductor materials at a low deposition temperature within a range of about 300° C. to about 400° C. directly on an amorphous template. The methods provide wafer-level fabrication of polycrystalline infrared detectors and monolithic integration with a readout integrated circuit wafer for focal plane arrays.

15 Claims, 4 Drawing Sheets

(56) References Cited

OTHER PUBLICATIONS

Einsele, Florian, et al., Analysis of sub-stoichiometric hydrogenated sillicon oxide films for surface passivation of crystalline silicon solar cells, Journal of Applied Physics, 2012, 054905-1-054905-8, 112, Published by American Institute of Physics 2012 copyright.

Okamoto, Y., et al., Passivation of defects in nitrogen-doped polycrystalline Cu2O thin films by crown-ether cyanide treatment, Applied Physics Letters, Feb. 17, 2003, pp. 1060-1062, vol. 82, No. 7, Published by American Institute of Physics 2003 copyright.

Bruno, G., et al., Hydrogen plasma passivation of InP: Real time ellipsometry monitoring and ex situ photoluminescence measurements, Applied Physics Letters, Jul. 29, 1996, pp. 685-687, vol. 69, No. 5, American Institute of Physics 1996 copyright.

De Wolf, Stefan, et al., Nature of doped a-Si:H/c-Si interface recombination, Journal of Applied Physics, 2009, pp. 103707-1-103707-6, 105, American Institute of Physics 2009 copyright.

Ishizuka, S., et al., Hydrogen treatment for polycrystalline nitrogen-doped Cu2O thin film, Journal of Crystal Growth, 2002, pp. 616-620, 237-239, Elsevier Science B.V. 2002 copyright.

Dong, J. J., et al., Effects of Hydrogen Plasma Treatment on the Electrical and Optical Properties of ZnO Films: Identification of Hydrogen Donors in ZnO, ACS Applied Material Interfaces, 2010, pp. 1780-1784, 2 (6). Copyright 2010 American Chemical Society.

Bae, Wan Ki, et al., Highly Effective Surface Passivation of PbSe Quantum Dots through Reaction with Molecular Chlorine, Journal of the American Chemical Society, Nov. 2012, pp. 20160-20168, 134, copyright 2012 American Chemical Society.

Keuleyan, Sean, et al., Photoluminescence of Mid-Infrared HgTe Colloidal Quantum Dots, The Journal of Physical Chemistry C, 2014, pp. 2749-2753, 118, copyright 2014 American Chemical Society.

Norton, Paul R., Infrared image sensors, Optical Engineering, Nov. 1991, pp. 1649-1663, vol. 30, No. 11.

Sorianello, Vito, et al., Low-temperature germanium thin films on silicon, Optical Materials Express, Sep. 1, 2011, pp. 856-865, vol. 1, No. 5, copyright 2011 Optical Society of America.

Wang, Jianfei, et al., Resonant-cavity-enhanced mid-infrared photodetector on a silicon platform, Optics Express, Jun. 7, 2010, pp. 12890-12896, vol. 18, No. 12, copyright 2010 Optical Society of America.

Wang, Jianfei, et al., Spectral Selective Mid-Infrared Detector on a Silicon Platform, IEEE, 2009, pp. 235-237, copyright 2009 IEEE.

Singh, Vivek, et al., Mid-Infrared materials and devices on a Si platform for optical sensing, Science and Technology of Advanced Materials, 2014, 15 pages, vol. 15, 014603, copyright 2014 National Institute for Material Science.

Kasap, Safa, et al., "Amorphous and Polycrystalline Photoconductors for Direct Conversion Flat Panl X-Ray Image Sensors," Sensors, 2011, pp. 5112-5157, vol. 11.

Sprafke, Thomas and Beletic, James W., "High-Performance Infrared Focal Plane Arrays for Space Applicaitons," Optics and Photonics News (OPN), Jun. 2008, pp. 21-27, vol. 19, No. 6, Optical Society of America.

Rogalski, Antoni, Infrared detectors: an overview, Infrared Physics and Technology, 2002, pp. 187-210, vol. 43, copyright 2002 Elsevier Science B. V.

\* cited by examiner

FABRICATION OF POLYCRYSTALLINE SEMICONDUCTOR INFRARED DETECTOR

CROSS-REFERENCE TO RELATED APPLICATIONS

N/A

STATEMENT REGARDING FEDERALLY SPONSORED RESEARCH OR DEVELOPMENT

BACKGROUND

1. Technical Field

The invention relates to infrared (IR) detectors fabricated using polycrystalline semiconductor materials. In particular, the invention relates to a polycrystalline IR detector and a fabrication technique on amorphous templates.

2. Description of Related Art

Infrared (IR) detectors are key components of focal plane arrays used in sensing and imaging applications in short-wave infrared (SWIR), medium-wave infrared (MWIR), and long-wave infrared (LWIR) spectral bands. The materials and processes used to fabricate IR detector impact performance metrics such as dark current density and spectral response, for example. IR detectors typically are fabricated using single-crystalline semiconductor materials to provide a level of sensitivity and performance in sensing and imaging applications in the above-mentioned spectral bands, for example for military applications. However, concomitant with performance and sensitivity is cost to manufacture the single-crystalline IR detectors and focal plane arrays for the specific applications. In particular, the manufacture of single-crystalline IR detectors and the focal plane arrays in which they are assembled is time-consuming and costly. Therefore, the performance metrics of the IR detectors in a particular application and the cost of the IR detectors present possible necessary trade-offs.

Photon detectors used in photovoltaic applications have been fabricated and evaluated using polycrystalline semiconductor materials, in particular for the manufacture of low cost solar cells. However, polycrystalline semiconductor materials characteristically have crystal defects, such as vacancies, dislocations and grain boundaries. These crystal defects typically result in detector performance degradation, for example due to excess dark current, which can limit the usefulness of polycrystalline semiconductor materials in sensitive SWIR, MWIR and LWIR applications. While progress with polycrystalline photon detectors for photovoltaic applications has been made to bring down cost while offering acceptable or tolerable performance in solar cell applications, an IR detector for sensitive SWIR, MWIR and LWIR applications using a lower cost fabrication technique and materials is still needed.

BRIEF SUMMARY

In some embodiments of the present invention, a method of fabricating a polycrystalline infrared (IR) detector is provided. The method of fabricating comprises providing an amorphous template. The method of fabricating further comprises depositing a Group III-V compound semiconductor material directly on the amorphous template at a low deposition temperature that is within a range of about 300° C. to about 400° C. The deposition comprises doping the Group III-V compound semiconductor material with a dopant profile to form the polycrystalline IR detector structure having a detector semiconductor junction.

In other embodiments of the present invention, a method of monolithic integration of an infrared (IR) detector in a focal plane array is provided. The method of monolithic integration comprises providing a readout integrated circuit (ROIC) wafer with an amorphous surface. The method of monolithic integration further comprises depositing Group III-V compound semiconductor materials directly on the amorphous surface of the ROIC wafer at a low temperature within a range of about 300° C. to less than 400° C. to form a polycrystalline IR detector structure having a semiconductor junction. The polycrystalline IR detector structure directly on the ROIC wafer forms a monolithically integrated structure to provide pixels of an IR focal plane array.

In some embodiments of the present invention, a polycrystalline mid-wave infrared (MWIR) detector structure is provided. The polycrystalline MWIR detector structure comprises an amorphous template, and a polycrystalline Group III-V compound semiconductor directly on the amorphous template. The polycrystalline MWIR detector structure further comprises a semiconductor junction in the polycrystalline Group III-V compound semiconductor, and electrically conductive contacts at opposite ends of the semiconductor junction. The polycrystalline MWIR detector structure has one or both of a dark current characteristic and a diode response substantially comparable to a single-crystalline Group III-V compound semiconductor MWIR detector.

BRIEF DESCRIPTION OF THE DRAWINGS

Various features of embodiments in accordance with the principles described herein may be more readily understood with reference to the following detailed description taken in conjunction with the accompanying drawings, where like reference numerals designate like structural elements, and in which.

Figure 1:
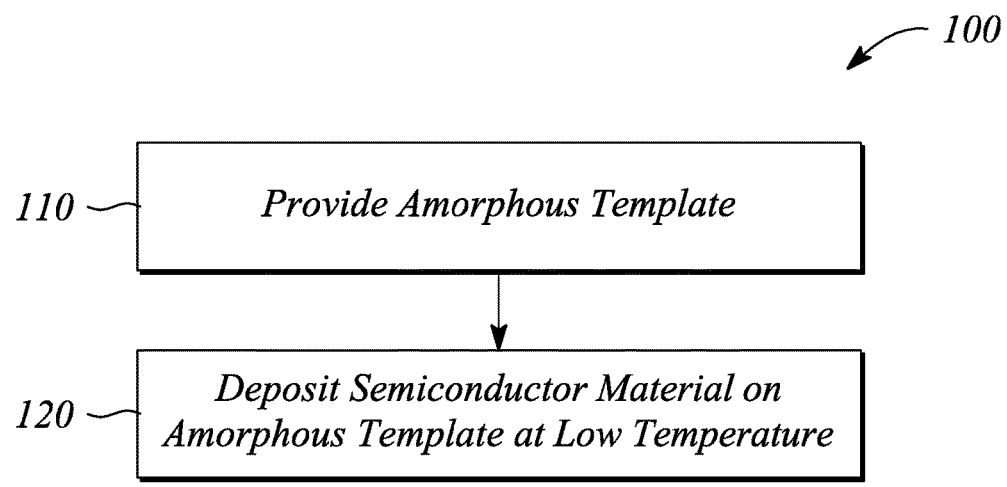
FIG. 1 illustrates a flow chart of a method of fabricating a polycrystalline infrared (IR) detector in an example, according to an embodiment consistent with the principles of the present invention.

Certain examples and embodiments have other features that are one of in addition to and in lieu of the features illustrated in the above-referenced figures. These and other features are detailed below with reference to the above-referenced figures.

DETAILED DESCRIPTION

Embodiments of the present invention are directed to providing sensitive IR detectors and systems that incorporate the IR detectors at lower cost than using traditional manufacturing. For example, traditional focal plane array manufacturing is a die-level process that relies upon dicing both a silicon readout integrated circuit (ROIC) wafer (e.g., typically 200 mm in diameter) and a compound semiconductor detector array wafer (e.g., typically 75-150 mm in diameter) into rectangular die (e.g., typical edge length of 10-40 mm). Individual ROIC die and individual compound semiconductor detector die are then interconnected using an array of indium bumps, achieved by compression bonding together of the respective individual die. The die-level process for focal plane array manufacture remains the norm.

On the other hand, wafer-level fabrication of IR detectors for focal plane arrays can reduce cost by eliminating time-consuming manufacturing steps, traditionally performed at die-level rather than at full wafer-level. However, wafer-level fabrication has been fraught with potential problems affecting device performance. For example, inherent in wafer-level fabrication of IR detectors for assembly in focal plane arrays is that the surface of the ROIC wafer is substantially amorphous or non-crystalline. Deposition of semiconductor material directly on an amorphous surface (or even a polycrystalline surface) has potential undesirable consequences. For example, typical deposition or growth techniques for semiconductor materials directly on such surfaces result in semiconductor structures that are polycrystalline, not single-crystalline, and therefore, have crystal defects that potentially can impact performance. Therefore, without a solution, the problems associated with crystal defects in polycrystalline semiconductor materials and the impact that crystal defects may have on device performance metrics have hindered progress with wafer-level fabrication.

Embodiments of the present invention address these difficulties and provide a solution for fabrication of IR detector on amorphous surfaces, including wafer-level fabrication, e.g., directly on the surface of ROIC wafers. In particular, embodiments consistent with the principles of the present invention provide an IR detector and a fabrication method that both include polycrystalline semiconductor detector structures and uses conventional deposition equipment to deposit or grow, at a low temperature, polycrystalline semiconductor materials directly on amorphous templates to form the polycrystalline semiconductor detector structures (i.e., 'direct fabrication'). Moreover, the methods in accordance with the embodiments herein provide a polycrystalline IR detector having a performance metric that may be comparable to a counterpart performance metric of a similar single-crystalline IR detector.

The amorphous template may be a wafer having an amorphous or non-crystalline surface, e.g., a ROIC wafer. In accordance with some embodiments herein, IR detector fabrication uses wafer-level processing and low-temperature deposition techniques to monolithically integrate the IR detector directly on a ROIC wafer for focal plane array manufacture. In some embodiments, the present invention enables the integration of a detector array and a silicon ROIC wafer to be achieved in a single process at full wafer-level, without interconnection through indium bumps. As such, substantial manufacturing cost-savings relative to the conventional manufacturing of focal plane arrays may be realized.

Moreover, in accordance with some embodiments herein, the direct fabrication process at low temperature produces a unique polycrystalline semiconductor IR detector structure that has performance metrics substantially comparable to those of a conventional single-crystalline IR detector of the same semiconductor materials. In particular, the polycrystalline IR detector on an amorphous template in accordance with the present invention has exhibited comparable performance metrics, such as dark current density and diode spectral response. As such, in some embodiments herein, a polycrystalline IR detector fabricated directly on the amorphous surface of a ROIC wafer and the focal plane arrays that incorporate them, in accordance with the principle described herein, may avoid costly die-level assembly of individual detector chips to ROIC chips for focal plane array manufacture without sacrificing performance, for example.

As used herein, the article 'a' is intended to have its ordinary meaning in the patent arts, namely 'one or more'. For example, 'a material' means one or more materials and as such, 'the material' means 'the material(s)' herein. Also, any reference herein to 'top', 'bottom', 'upper', 'lower', 'up', 'down', 'front', 'back', 'left' or 'right' with respect to direction, or 'first' or 'second' with respect to priority, order or sequence, for example, is not intended to be a limitation herein. Herein, the term 'about' when applied to a value generally means within the tolerance range of the equipment used to produce the value, or may mean plus or minus 20%, or plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples and embodiments herein are intended to be illustrative only and are presented for discussion purposes and not by way of limitation.

According to some embodiments of the present invention, a method of fabricating a polycrystalline infrared (IR) detector structure is provided. FIG. 1 illustrates a flow chart of a method 100 of fabricating a polycrystalline infrared (IR) detector structure in an example, according to an embodiment consistent with the principles of the present invention.

The method 100 of fabricating polycrystalline infrared (IR) detector structure comprises providing 110 an amorphous template. Amorphous templates are described further below, and include, but are not limited to, a semiconductor wafer, e.g., a wafer comprising embedded or underlying microelectronic circuitry. The method 100 of fabricating polycrystalline infrared (IR) detector structure further comprises depositing 120 a Group III-V compound semiconductor material directly on the amorphous template at a low deposition temperature that is within a range of about 300° C. to about 400° C. The deposition 120 comprises doping the Group III-V compound semiconductor material with a dopant profile to form a polycrystalline IR detector structure having a detector semiconductor junction. Doping of the Group III-V compound semiconductor material is performed simultaneously with the deposition of the Group III-V compound semiconductor material, or in some embodiments, a portion of the doping may be performed after the Group III-V compound semiconductor material is deposited, for example using ion implantation of dopant materials.

The deposition 120 of a Group III-V compound semiconductor material, in accordance with the method 100 of fabrication, uses a deposition or growth technique including, but not limited to, one or more of molecular beam epitaxy (MBE) and a chemical vapor deposition (CVD) technique, such as metal organic CVD (MOCVD), for example. Both MBE and MOCVD are compatible with the low deposition temperature that is within the range of about 300° C. to about 400° C. Moreover, the deposition techniques are compatible with either simultaneously doping or subsequently doping the semiconductor materials, in accordance with the method 100 of fabrication. For example, simultaneously doping includes, for example, providing a flux of dopant atoms with the constituent Group III-V compound semiconductor material during deposition 120.

By 'low temperature' of deposition, it is meant a deposition temperature below a critical temperature of the amorphous template. By 'critical temperature' it is meant a temperature at which continued exposure at the critical temperature will degrade microelectronic circuitry underlying the amorphous template. By 'continued exposure' it is meant at least a deposition time period of depositing 120 the Group III-V compound semiconductor material that form the polycrystalline IR detector structure. In some embodiments, the critical temperature is below 450° C., or may be less than about 400° C., e.g., for silicon-based amorphous templates. In some embodiments, the range of the low deposition temperature used herein is within about 300° C. to about 375° C., or within about 300° C. to about 350° C., or within about 300° C. to about 325° C. In an embodiment, the low deposition temperature used is about 325° C.

In some embodiments, the amorphous template provided 110 in accordance with the method 100 includes, but is not limited to, a ceramic substrate, a glass substrate, a metal substrate, a semiconductor substrate or wafer, or a semiconductor substrate or wafer with amorphous surface. By 'amorphous surface' it is meant that the substrate or wafer is amorphous or non-crystalline (e.g., an amorphous semiconductor wafer), or the substrate or wafer has an amorphous surface that is one or both (a) by virtue of the wafer being amorphous and (b) due to an amorphous layer (e.g., an oxide layer) being on the substrate or wafer surface. In an example, the amorphous template is a silicon substrate having a silicon dioxide layer on the surface of the silicon substrate, for example, an oxidized Czochralski silicon substrate.

In some embodiments, the amorphous template is an amorphous surface of a readout integrated circuit (ROIC) wafer used in the manufacture of focal plane arrays. The ROIC wafer is a semiconductor wafer made from semiconductor materials that facilitate and support integrated circuit formation, such as silicon, germanium or a compound semiconductor material, for example gallium arsenide (GaAs). The ROIC wafer may be a single-crystalline semiconductor wafer (e.g., silicon-based wafer) that comprises fabricated integrated circuitry (e.g., the above-mentioned 'underlying microelectronic circuitry') for the operation of a focal plane array. For example, an ROIC wafer may typically include an array of preamplifiers and switches. The fabrication of the integrated circuitry on or in the readout wafer renders the surface of the ROIC wafer as amorphous. Moreover, the ROIC wafer surface may include an amorphous layer of an interlayer dielectric material (ILD). ILDs facilitate isolation of electrical contacts at the wafer surface that connect to various underlying microelectronic circuitry.

In accordance with the method 100 of fabrication, the provided 110 amorphous template may include the above-described ROIC wafer. The critical temperature of a ROIC wafer is about 450° C., at least due to the fabricated integrated circuitry on the ROIC wafer. The deposition 120 of the IR detector semiconductor materials, according to the method 100, uses a temperature below the critical temperature of the ROIC wafer, as well as below other amorphous templates, in accordance with the principles described herein.

Moreover, in the embodiments where the provided 110 amorphous template is an ROIC wafer, the Group III-V compound semiconductor material is deposited 120 directly on the amorphous surface of the ROIC wafer and doped to form the polycrystalline IR detector structure. For example, the temperature range of depositing 120 the Group III-V compound semiconductor may be about 300° C. to about 350° C. As such, the method 100 of fabrication monolithically integrates the polycrystalline IR detector structure with the ROIC wafer circuitry to simultaneously form a plurality of focal plane arrays (FPA) that can be separated by subsequent dicing into individual FPA die.

In these embodiments, the monolithic integration eliminates cumbersome conventional die-level additional hybridization steps where the IR detectors are fabricated separately, sub-divided into individual chips or die that are then manually assembled and electrically connected to sub-divided die of the ROIC wafer, e.g., using one or more of conventional indium bumping and wire bonding, as described above. Moreover, the polycrystalline IR detector structure fabricated using the method 100 may have one or both of a dark current characteristic and a diode response substantially comparable to single-crystalline Group III-V compound semiconductor IR detectors, in some embodiments.

The Group III-V compound semiconductor material that is deposited 120 comprises one or more elements from Group III alloyed with one or more elements from Group V of the Periodic Table of the Elements. Examples of the Group III-V compound semiconductor material include one or more of indium (In), aluminum (Al) and gallium (Ga) from Group III with one or more of phosphorous (P), arsenic (As) and antimony (Sb) from Group V. In some embodiments, the Group III-V compound semiconductor material includes one or more of In, Al, As and Sb, or two or more of In, Al, As and Sb. In some embodiments, the Group III-V compound semiconductor material includes one or more deposition layers of InAs, AlSb, AlGaSb, InSb, and InAsSb. In some embodiments, the polycrystalline IR detector structure fabricated according to the method 100 of fabrication may be a MWIR detector, for example an InAsSb MWIR detector or an InAs MWIR detector.

Figure 2:
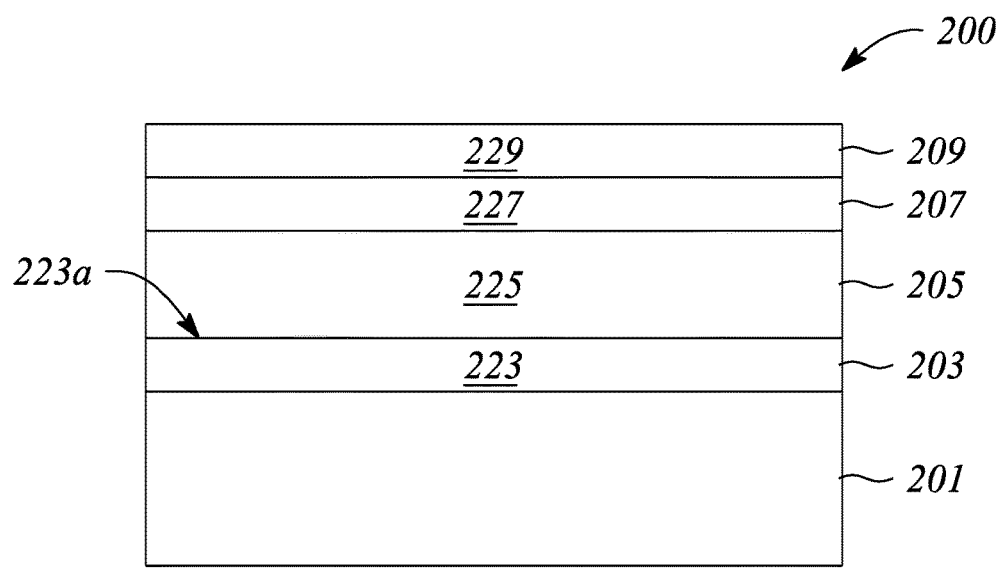
FIG. 2 illustrates a side view of a polycrystalline IR detector fabricated according to the method of FIG. 1 in an example, according to an embodiment consistent with the principles of the present invention.

As provided above, the method 100 of fabrication further comprises depositing 120 the Group III-V compound semiconductor material with a dopant profile to form the polycrystalline IR detector structure having a detector semiconductor junction. The detector semiconductor junction may be a p-n type junction, for example. FIG. 2 illustrates a side view of a polycrystalline IR detector 200 fabricated according to the method 100 of FIG. 1 in an example, according to an embodiment consistent with the principles of the present invention.

Referring to the polycrystalline IR detector 200 illustrated in FIG. 2, in some embodiments of the method 100 of fabrication of FIG. 1, a first contact layer 203 of a first Group III-V compound semiconducting material is deposited 120 directly on the provided 110 amorphous template 201. The first contact layer 203 is polycrystalline and includes a first doping level 223 of the dopant profile. In some embodiments, the first contact layer 203 is doped to provide an n⁺-type or p⁺-type dopant and doping level 223 adjacent to the amorphous surface of the provided 110 template 201 to render the first contact layer substantially electrically conductive. Further, in some embodiments, the first contact layer 203 is doped to include a doping level gradient within the first contact layer 203 that transitions from substantially electrically conductive to relatively less electrical conductivity. In particular, the transition is from the corresponding n⁺ or p⁺ doping level 223 to a corresponding n⁻ or p⁻ doping level 223a at a surface of the deposited first contact layer 203 (i.e., doping level 223 is greater than doping level 223a).

In some embodiments, the n or p doping level may be within a range of about $10^{15}$ cm$^{-3}$ to about $10^{16}$ cm$^{-3}$, and the n⁺ or p⁺ doping level may be within a range of about $10^{17}$ cm$^{-3}$ to about $10^{19}$ cm$^{-3}$, for example. Moreover, the doping level for the n⁻ or p⁻ doping level may be within a range of about $10^{13}$ cm$^{-3}$ to about $10^{14}$ cm$^{-3}$, for example.

Referring again to FIG. 2, the polycrystalline IR detector 200 further includes an absorber layer 205 of a second Group III-V compound semiconducting material that is deposited 120 on the first contact layer 203. The absorber layer 205 is also polycrystalline and includes a second doping level 225 of the dopant profile. The absorber layer 205 is doped to provide the corresponding n⁻-type or p⁻-type dopant and the second doping level 225. In some embodiments, the second doping level 225 may be substantially similar to the adjacent surface doping level 223a of the first contact layer 203.

Further with respect to FIG. 2, the polycrystalline IR detector 200 in some embodiments, further includes a barrier layer 207 of a third Group III-V compound semiconducting material that is deposited 120 on the absorber layer 205. The barrier layer 207 is also polycrystalline and includes a third doping level 227 of the dopant profile. The barrier layer 207 is doped to provide either the same or an opposite dopant type to the n⁻-type or p⁻-type dopant of the absorber layer 205. Moreover, in some embodiments, the third doping level 227 of the barrier layer 207 is greater than the second doping level 225 of the absorber layer 205.

The polycrystalline IR detector 200 illustrated in FIG. 2 further includes a second contact layer 209 of a fourth Group III-V compound semiconducting material that is deposited 120 on the barrier layer 207. The second contact layer 209 is polycrystalline and includes a fourth doping level 229 of the dopant profile. The second contact layer 209 is doped to provide either a corresponding or an opposite dopant type of the absorber layer 205, but has an increased doping level 229 of n⁺-type or p⁺-type dopant relative to the doping level 225 of the absorber layer 205. Moreover, the higher fourth doping level 229 renders the second contact layer 209 relatively more electrically conductive than the absorber layer 205. However, the fourth doping level 229 of the second contact layer 209 may be substantially similar to the first doping level 223 of the first contact layer 203, in some embodiments.

In some embodiments, the above-described first, second, third and fourth (i.e., 'first through fourth') doping levels 223, 223a, 225, 227, 229 and dopant types of the various first through fourth Group III-V compound semiconducting material layers form the dopant profile of the detector semiconductor junction of the polycrystalline IR detector 200 fabricated in accordance with the method 100 of fabrication. Dopant materials used for the method 100 of fabricating include, but are not limited to, beryllium (Be), silicon (Si), carbon (C), and tellurium (Te).

In some embodiments, the first dopant level 223 of the first contact layer 203 and the fourth doping level 229 of the second contact layer 209 each is within the range of about $1\times10^{17}$ cm$^{-3}$ to about $9\times10^{17}$ cm$^{-3}$. Moreover, the first doping level 223 may decrease to within a range of about $5\times10^{15}$ cm$^{-3}$ to about $5\times10^{16}$ cm$^{-3}$ to the surface doping level 223a at the surface of the first contact layer 203. In some embodiments, the absorber layer 205 second doping level 225 is within the range of about $1\times10^{15}$ cm$^{-3}$ to about $5\times10^{16}$ cm$^{-3}$, and for example, may be the substantially the same as the level of the adjacent surface doping level 223a of the contact layer 203. The barrier layer 207 third doping level 227 is within the range of about $1\times10^{15}$ cm$^{-3}$ to about $1\times10^{17}$ cm$^{-3}$, in some embodiments.

In some embodiments, the first, second, third and fourth Group III-V compound semiconducting materials deposited 120 to fabricate the polycrystalline IR detector 200 may one or both of be stoichiometrically different and comprise different semiconducting materials. In other embodiments, one or more of the first, second, third and fourth Group III-V compound semiconducting materials may comprise the substantially the same materials (albeit, with possible stoichiometric differences), while others of the first, second, third and fourth Group III-V compound semiconducting materials may comprise different materials.

For example, the first Group III-V compound semiconducting material (i.e., contact layer 203) may comprise substantially the same semiconducting materials as the second Group III-V compound semiconducting material (i.e., absorber layer 205). Moreover, in some examples, the second Group III-V compound semiconducting material (i.e., absorber layer 205) may comprise a different semiconducting material than the third Group III-V compound semiconducting material (i.e., barrier layer 207). In some examples, the first and fourth Group III-V compound semiconducting materials (i.e., first and second contact layers 203, 209) may comprise substantially the same semiconductor materials. Other variations in the similarities and differences between the compositions of the first through fourth Group III-V compound semiconducting materials are also within the scope of the principles described herein and those described above are not intended as a limitation.

In an embodiment of the polycrystalline IR detector 200 fabricated using the method 100, the Group III-V compound semiconducting materials of the first contact layer 203, the absorber layer 205 and the second contact layer 209 each comprises InAsSb. Further in this embodiment, the barrier layer 207 comprises AlSb to form a polycrystalline InAsSb MWIR detector 200. In another embodiment, the barrier layer 207 comprises AlGaAsSb to form another polycrystalline MWIR detector 200.

In some embodiments of the fabricated polycrystalline IR detector 200 according to the method 100, the thickness of the first contact layer 203 may be within a range of about 750 angstroms (Å) to about 2,000 Å, wherein a thickness region of the gradient or transition to the surface doping level 223a of the first contact layer 203 is about one-third to about three-fourths of the first contact layer thickness. Moreover in some embodiments, the thickness of the absorber layer 205 may be within a range of about 3,500 Å to about 35,000 Å. The thickness of the barrier layer 207 may be within a range of about 1000 Å to about 2000 Å, in some embodiments. Further, in some embodiments, the thickness of the second contact layer 209 may be within a range of about 500 Å to about 1,500 Å.

Other ranges of various layer thicknesses are also within the scope of the principles described herein and those described above are not intended as a limitation. For example, the thickness of the absorber layer 205 may be within a range of about one micron to about five microns; or about one micron to about two microns, or about two microns to about four microns, or two microns to about three microns, or three microns to about five microns. In another example, the thickness of the barrier layer 207 may be within a range of about 100 nm to about 400 nm; or about 200 nm to about 400 nm; or about 100 nm to about 200 nm. Moreover, the thickness of the second contact layer 209 may be substantially similar to the thickness of the first contact layer 203 in some examples.

In some embodiments, the method 100 of fabricating a polycrystalline IR detector structure may further comprise passivating grain boundaries of the polycrystalline IR detector in a controlled manner with hydrogen atoms. The grain boundaries may be passivated in a controlled manner in accordance with any of the methods described in a co-pending U.S. patent application Ser. No. 15/885,693, entitled "Grain Boundary Passivation of Polycrystalline Materials," which is filed the same day as the present application, and has the same Assignee. This co-pending application is incorporated by reference in its entirety herein.

For example, in some embodiments, the controlled grain boundary passivation comprises exposing the polycrystalline IR detector (e.g., polycrystalline IR detector 200) to controlled pulses of a plasma at a temperature maintained within a range of about 100° C. to less than 200° C. for a period of time. The plasma comprises a mixture of a carrier gas and hydrogen gas, wherein the hydrogen gas is mixed into a plasma of the carrier gas. The carrier gas plasma breaks some of the hydrogen gas into elemental hydrogen (i.e., hydrogen atoms) in the plasma and the hydrogen atoms are carried to the polycrystalline semiconductor structure by the carrier gas for incorporation into the grain boundaries. The hydrogen and carrier gases may be mixed in a ratio of gases that may be within a range of about 0.1:10 to about 1.0:10 hydrogen to carrier gas.

Moreover, in some embodiments, the controlled pulses may comprise a plasma pulse duration within a range of about 5 seconds to about 20 seconds, and a rest time between the plasma pulses within a range of about 2 seconds to about 10 seconds. An exposure period of time of pulsing may be within a range of about 15 minutes to about 240 minutes. Moreover, a pulse power may be within a range of about 20 Watts to about 300 Watts. It is within the scope of the present application herein that any of the ranges described in the above-mentioned co-pending U.S. application may be used.

Characteristics of the plasma pulse may comprise one or more of a quantity of the pulses, a pulse duration, a rest period between the pulses, and a pulse power, for example, during the time period of the pulsed exposure. A combination of gas flows of the hydrogen gas and the carrier gas in the formed plasma gas mixture may further facilitate incorporation of the hydrogen atoms into the grain boundaries. For example, the gas flow of the hydrogen gas may be a fraction of the gas flows of the carrier gas and the carrier gas plasma. In an embodiment, the gas flow of the carrier gas may be about thirty times, and the gas flow of the carrier gas plasma may be about eighty times, more than the gas flow of the hydrogen gas in the formed plasma gas mixture, for example.

In some embodiments, the controlled grain boundary passivation of the polycrystalline IR detector may further alleviate an impact of grain boundary defects in the polycrystalline semiconductor material and may further improve performance metrics of the polycrystalline IR detector structure fabricated using the method 100. For example, the hydrogen atoms may combine with various semiconductor atoms (e.g., In, As, Sb, etc.) in the polycrystalline structure that may have dangling bonds, such as those bonds found in grain boundaries or on surfaces. A hydrogen atom may combine with a dangling bond so that the dangling bond does not trap a photo carrier electron, for example. In some embodiments, the polycrystalline IR detector 200 further comprises hydrogen atoms embedded in polycrystalline grain boundaries of the polycrystalline Group III-V compound semiconductor as a passivation.

Figure 3:
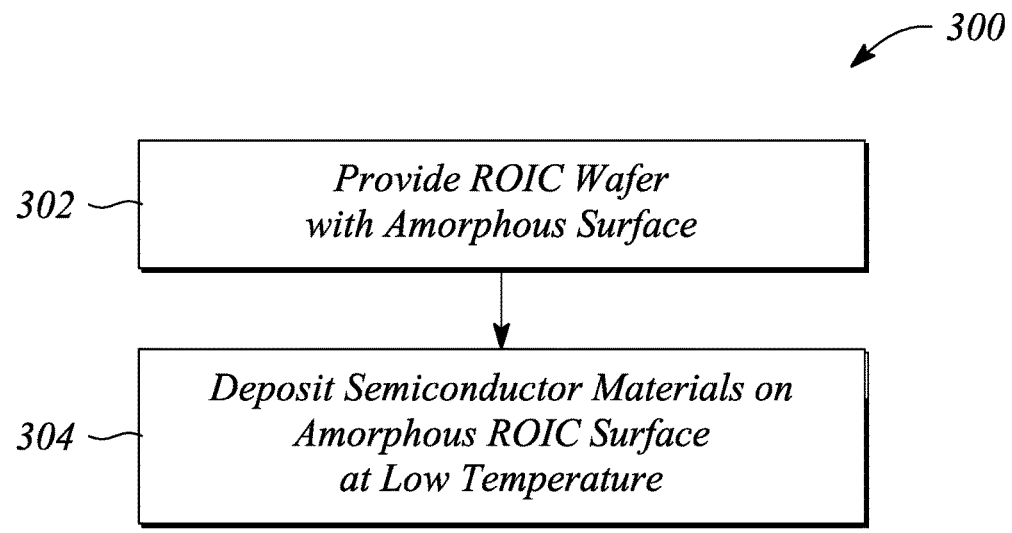
FIG. 3 illustrates a flow chart of a method of monolithic integration of an infrared (IR) detector in a focal plane array in an example, according to an embodiment consistent with the principles of the present invention.

According to some embodiments of the present invention, a method of monolithic integration of an IR detector in a focal plane array is provided. FIG. 3 illustrates a flow chart of a method 300 of monolithic integration of an IR detector in a focal plane array in an example according to the principles described herein.

The method 300 of monolithic integration comprises providing 302 a readout integrated circuit (ROIC) wafer having an amorphous surface. The method 300 of monolithic integration further comprises depositing 304 Group III-V compound semiconductor materials directly on the amorphous surface of the ROIC wafer at a low temperature within a range of about 300° C. to less than 400° C. The deposition 304 comprises forming a semiconductor junction in the Group III-V compound semiconductor materials to form a polycrystalline IR detector structure that is monolithically integrated with the ROIC wafer. The 'integral polycrystalline IR detector-ROIC monolithic structure' formed by the method 300 provides pixels of a focal plane array (FPA).

In some embodiments of the method 300 of monolithic integration, the temperature range of the deposition 304 is substantially similar to the temperature ranges set forth above for the method 100 of fabricating a polycrystalline IR detector structure. For example, the temperature range may be within about 300° C. to about 375° C. Moreover, the deposition 304 may use a deposition technique including but not limited to, MBE or MOCVD, for example. In some embodiments, the Group III-V compound semiconductor materials deposited 304 in accordance with the method 300 of monolithic integration are substantially similar to the Group III-V materials described above for the method 100 of fabricating a polycrystalline IR detector structure. For example, the compound semiconductor materials of the IR detector may comprise two or more of indium, aluminum, gallium, arsenic and antimony.

Further, according to the method 300 of monolithic integration, the semiconductor junction is provided by doping the Group III-V materials. In some embodiments, the semiconductor junction is provided using substantially similar dopants, dopant levels, and dopants profiles described above for the detector semiconductor junction of the polycrystalline IR detector structure formed in the method 100 of fabrication (e.g., the detector 200 of FIG. 2). For example, the semiconductor junction may be a p-n type junction, or may be an n-p type junction. In some embodiments, doping to provide a semiconductor junction with a dopant profile in both the method 100 of fabricating and the method of 300 monolithic integration may be performed with the deposition of the Group III-V semiconductor materials or a portion of the doping may be provided thereafter.

In some embodiments, the polycrystalline IR detector structure formed in accordance with the method 300 of monolithic integration may be substantially similar to the polycrystalline IR detector structure fabricated by the method 100 of fabrication. For example, the polycrystalline IR detector structure portion of the 'integral polycrystalline IR detector-ROIC monolithic structure' may comprise an absorber layer and a barrier layer sandwiched between first and second contact layers, as described above with respect to polycrystalline IR detector 200 of FIG. 2 and with respect to the method 100 of fabrication of FIG. 1. Moreover, the ROIC wafer used in the method 300 of monolithic integration may be substantially the same as the ROIC wafer described above as an example of the amorphous template used in the method 100 of fabrication. For example, the ROIC wafer may be a silicon-based ROIC wafer having underlying microelectronic circuitry comprising a plurality of amplifiers and switches.

In particular, in accordance with the method 300 of monolithic integration, the ROIC wafer comprises a plurality of amplifiers and switches with circuit contacts at the ROIC wafer surface. The monolithic integration of the method 300 herein not only directly physically connects the ROIC wafer and the polycrystalline IR detector structure together but also forms intrinsic electrical connections between various circuit contacts of the ROIC wafer and the polycrystalline IR detector structure. For example, the monolithic integration includes multiple depositions 304 of respective Group III-V materials with masking and etching between depositions to define pixels isolated from one another, but which have contact to unit-cell contact metallization in the ROIC wafer. Moreover, inter-layer dielectric (ILD) materials patterned with electrical interconnects provide an interface between the ROIC wafer surface and the deposited 304 first contact layer of the Group III-V compound semiconductor materials. In some embodiments, the resulting 'integral polycrystalline IR detector-ROIC monolithic structure' provides a pixel or an array of pixels of an IR FPA.

Moreover, the method 300 of monolithic integration as described herein avoids conventional time-consuming manufacturing or assembly steps that include dicing an IR detector wafer and the ROIC wafer into respective individual die and manually indium bumping or wire bonding the individual IR detector die to the ROIC wafer die to assembly pixels of an IR FPA, as in conventional FPA manufacturing. In some embodiments, the 'integral polycrystalline IR detector-ROIC monolithic structure' in accordance with the method 300 may be a MWIR FPA.

In some embodiments, the method 300 of monolithic integration may further comprise passivating grain boundaries of the polycrystalline IR detector-ROIC monolithic structure in a controlled manner with hydrogen atoms. The grain boundary passivation may be substantially similar to the passivation described above for the method 100 of fabrication, and includes the above-referenced co-pending application, incorporated by reference in its entirety. The grain boundary passivation with hydrogen atoms in a controlled manner using gas plasma pulses at low temperature, i.e., less than about 200° C., as described in the above-incorporated by reference co-pending application, may further improve performance metrics of the polycrystalline IR detector portion of the polycrystalline IR detector-ROIC monolithic structure, for example dark current density characteristic. Moreover, the grain boundary passivation with hydrogen atoms in a controlled manner using gas plasma pulsing at low temperature does not negatively impact the underlying microelectronic circuitry of the ROIC portion of the polycrystalline IR detector-ROIC monolithic structure.

In accordance with some embodiments herein, the above-described polycrystalline IR detector structure 200 has one or both of a dark current density characteristic and a diode spectral response substantially comparable to single-crystalline Group III-V compound semiconductor IR detectors. For example, for a given temperature (e.g., in degrees Kelvin), single-crystalline Group III-V compound semiconductor IR detectors may achieve a dark current density that is infinitesimally small at a reverse bias voltage of about 50.0 millivolts (mV) (e.g., dark current density within a range of from about $10^{-2}$ to about $10^{-1}$ Amps per square centimeter ($A/cm^2$) at an operating temperature of 230K). The polycrystalline Group III-V compound semiconductor IR detector structure in accordance with the various embodiments of the present invention described herein has a dark current density characteristic that may be substantially comparable to that of its counterpart single-crystalline Group III-V compound semiconductor IR detector. Performance metrics for an example polycrystalline IR detector structure that was fabricated in accordance to an embodiment of the method 100 described herein are further described below with respect to the Example.

Example

A polycrystalline InAs barrier detector structure was fabricated on an amorphous template. The amorphous template used was a Czochralski (CZ) silicon wafer that was thermally oxidized to form a $SiO_2$ surface layer (i.e., amorphous surface). The amorphous template used was intended to simulate a surface of an ROIC wafer. After a hydrogen gas ($H_2$) desorption step at 400° C. to remove contamination from the $SiO_2$ wafer surface, InAs compound semiconductor material was deposited directly onto the oxidized silicon wafer. The polycrystalline InAs material was doped during deposition with silicon (Si) as an n-type dopant at a varying concentration level (gradient) to form a contact layer of higher dopant concentration and an absorber layer with a relatively lower dopant concentration.

After a pause of 40 seconds to transition from In and As fluxes to Al and Sb fluxes, AlSb compound semiconductor material was then deposited on the polycrystalline InAs material as a barrier layer. The polycrystalline AlSb material layer was doped with beryllium (Be) as a p-type dopant during deposition. After another pause of 400 seconds to permit changes in the Be dopant atom flux and In and As fluxes, InAs was deposited on the polycrystalline AlSb layer and doped during deposition with the p-type dopant at a higher dopant concentration than the AlSb layer. A p-n type detector semiconductor junction was formed in the fabricated polycrystalline detector structure.

The InAs and AlSb compound semiconductor materials were deposited and doped using molecular beam epitaxy at a deposition temperature of 325° C. Table 1 summarizes some parameters of the deposition process used. The thickness and total depth values in Table 1 were nominal values specified in Angstroms (Å).

Figure 4:
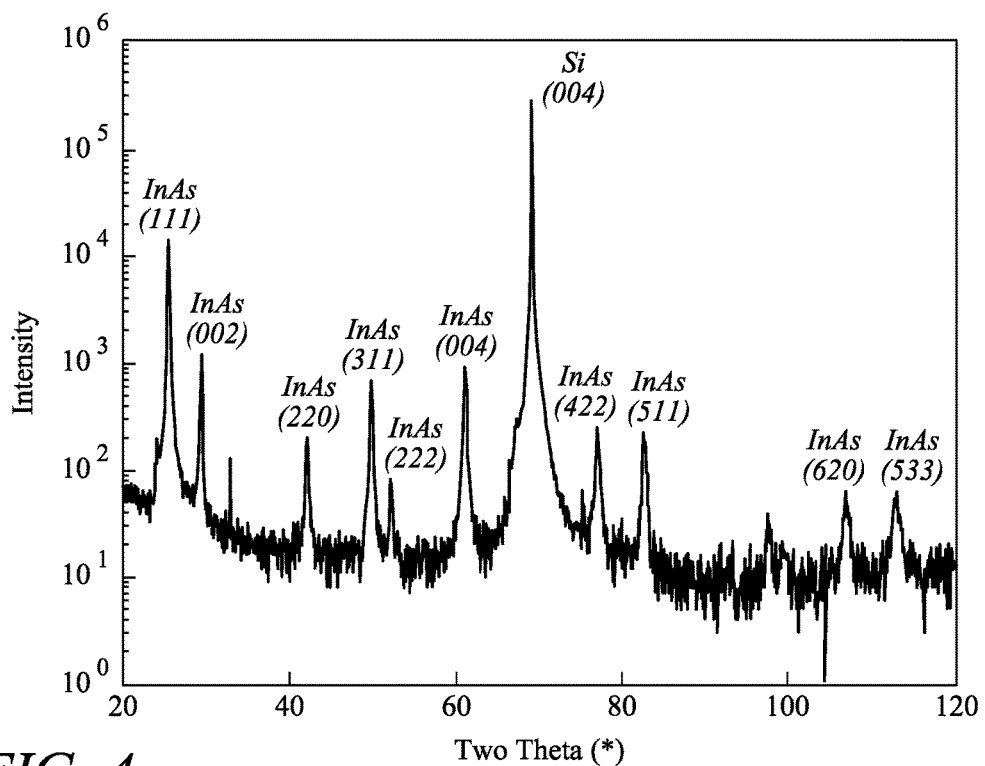
FIG. 4 illustrates a graph of an X-ray diffraction spectrum of a fabricated polycrystalline InAs barrier detector structure in an example, according to an embodiment consistent with the principles of the present invention.

FIG. 4 illustrates a graph of an X-ray diffraction spectrum of the polycrystalline InAs barrier detector structure formed using the above-described parameters, collected on a Phillips X'pert Diffractometer (PANalytical, Almelo, Netherlands). The various numbers in parenthesis in FIG. 4 are Miller indices of the crystal planes of the polycrystalline material responsible for the various peaks in the X-ray spectrum.

TABLE 1

Deposition parameters of fabricated polycrystalline InAs barrier detector structure

| Layer | Material | Thickness (Å) | Total Depth (Å) | Doping (cm³) |
|---|---|---|---|---|
| p⁺ Contact | InAs | 1000 | 1000 | Be = $5 \times 10^{17}$ |
| | | PAUSE | | |
| Barrier | AlSb | 1200 | 2200 | Be = $2 \times 10^{16}$ |
| | | PAUSE | | |
| n⁻ Absorber | InAs | 15000 | 17200 | Si = $1 \times 10^{16}$ |
| Grade to n⁻ | InAs | 500 | 17700 | Si = $5 \times 10^{17}$ to $1 \times 10^{16}$ |
| n⁺ Contact | InAs | 1000 | 18700 | Si = $5 \times 10^{17}$ |
| | | PAUSE: $H_2$ Desorb | | |
| Substrate | CZ Si: Oxidized | | | |

To evaluate the dark current density and diode spectral response of the fabricated polycrystalline InAs barrier detector structure, the fabricated detector structure wafer was then divided into individual InAs barrier detector chips ranging in size from about 100 microns (μm) to about 400 μm. For evaluation only, a wet chemical etch was used to delineate the individual detector diodes. The dark current density was evaluated over a bias voltage range of −1.0V to 0.2V using an Agilent B1500 Semiconductor Device Analyzer (Keysight Technologies, CA).

Figure 5A:
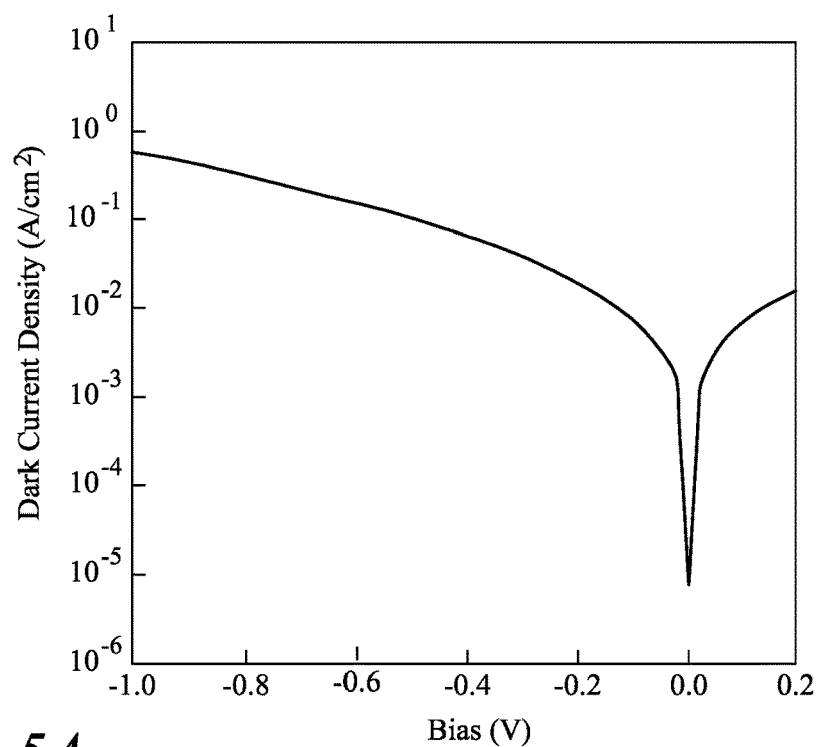
FIG. 5A illustrates a graph of a dark current density characteristic of the fabricated polycrystalline InAs barrier detector structure in an example, according to an embodiment consistent with the principles of the present invention.
Figure 6:
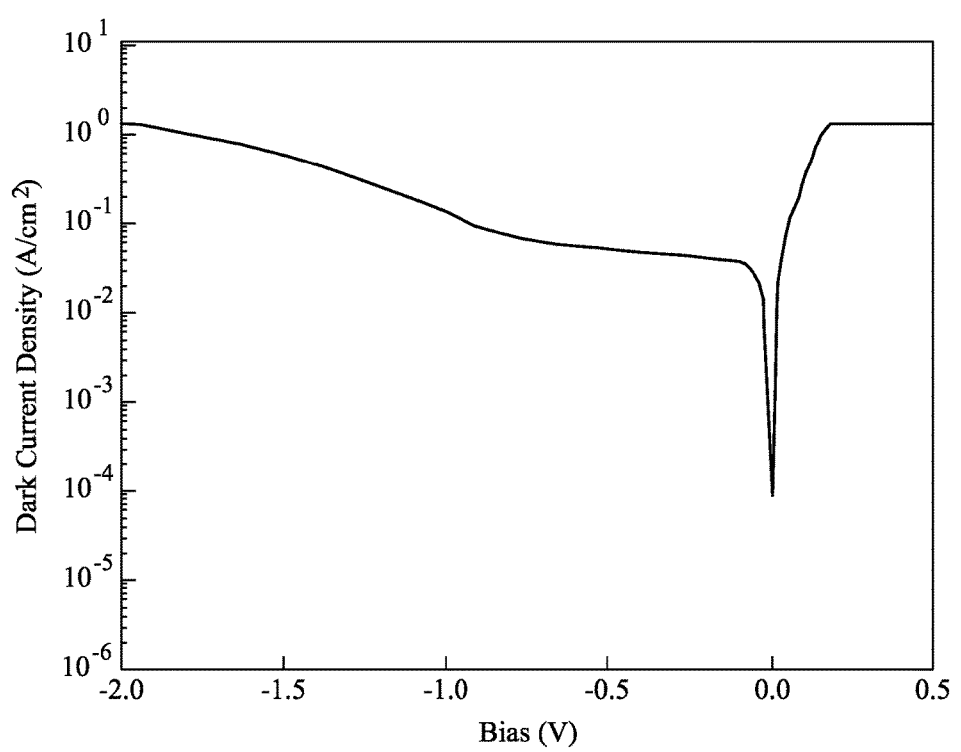
FIG. 6 illustrates a graph of a dark current density characteristic of a single-crystalline IR device as a comparison to the dark current density characteristic results illustrated in the FIG. 5A graph for the fabricated polycrystalline InAs barrier detector structure in an example, according to an embodiment consistent with the principles of the present invention.

FIG. 5A illustrates a graph of dark current density versus reverse bias voltage for the fabricated InAs barrier detector example, at a temperature of 240 K. From the graph in FIG. 5A, the dark current density measured at a reverse bias of −0.2 V for the fabricated polycrystalline InAs barrier detector example was about $3 \times 10^{-2}$ Å/cm². The reverse bias of −0.2 V represents an operational reverse bias voltage that can typically range from about −50 mV to −200 mV. The values measured for the fabricated InAs barrier detector example are consistent with performance metrics of comparable single-crystalline InAs detectors. FIG. 6 illustrates a graph of dark current density versus reverse bias voltage for a single-crystalline detector as a comparison. The dark current density of single-crystalline detector is about $4 \times 10^{-2}$ Å/cm² at a reverse bias of −200 mV in FIG. 6.

Figure 5B:
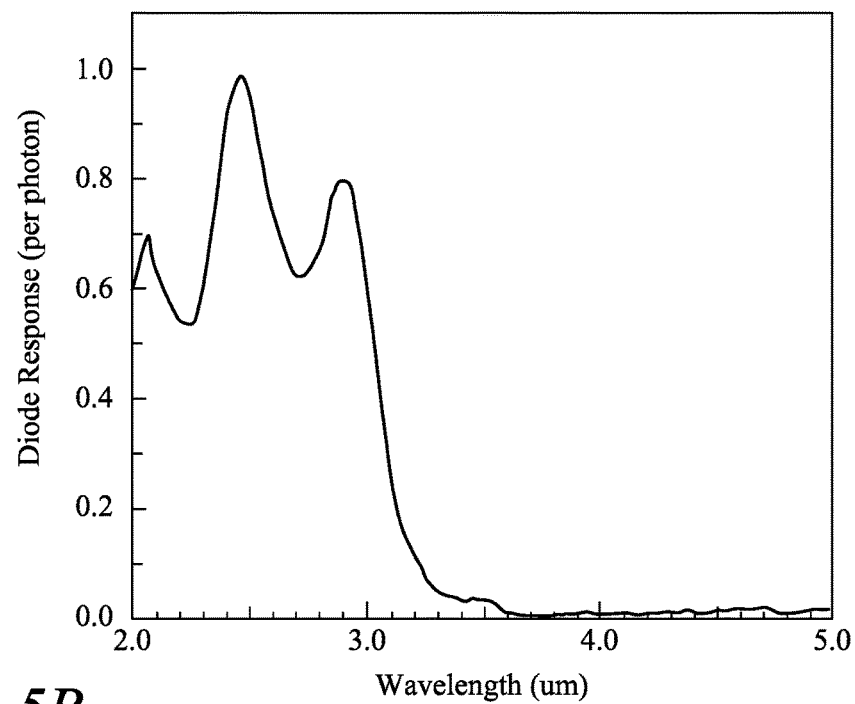
FIG. 5B illustrates a graph of a spectral response of the fabricated polycrystalline InAs barrier detector structure in an example, according to an embodiment consistent with the principles of the present invention.

The diode spectral response of the fabricated InAs barrier detector example was measured in a wavelength range of 2.0 microns to 5.0 microns at a temperature of 85 K (T=85K) using a Thermo-Nicolet Nexus 670 FTIR spectrometer (Thermo Fisher Scientific, Waltham, Mass.). FIG. 5B illustrates a graph of diode spectral response per photon versus wavelength of the fabricated polycrystalline InAs barrier detector example at the temperature of 85 K. From the graph in FIG. 5B, the spectral response (diode response (per photon)) of the fabricated polycrystalline InAs barrier detector example indicates that the device has a cutoff wavelength of 3.03 μm as determined by the semiconducting bandgap of the polycrystalline InAs. As a comparison, a typical single-crystalline InAs detector may have a cut-off wavelength within a range of 3 μm and 3.5 μm, depending on the temperature (e.g., 77 K to 195 K).

The performance metrics achieved for the InAs barrier detector example are representative of metrics achievable by the polycrystalline Group III-V compound semiconductor IR detector structure that is fabricated and monolithically integrated according to the principles of the present invention. As such, the principles of the present invention, as described herein, enable a polycrystalline Group III-V compound semiconductor IR detector to be utilized as FPA detectors directly on Si-based ROIC wafers in wafer-level fabrication. Concomitantly, the conventional time-consuming and costly steps that include indium-bumping individual single-crystalline detector die or chips and individual ROIC die in a die-level hybridization process to form an FPA may be avoided.

Thus, there have been described examples of a polycrystalline IR detector a method of fabricating polycrystalline IR detector structures and a method of monolithic integration of polycrystalline IR detector structures with FPAs using wafer-level fabrication, both methods at low temperature on amorphous templates. It should be understood that the above-described embodiments and examples are merely illustrative of some of the many specific examples and embodiments that represent the principles consistent with the principles described herein. Clearly, those skilled in the art can readily devise numerous other arrangements without departing from the scope consistent with the principles described herein as defined by the following claims.

What is claimed is:

1. A method of fabricating a polycrystalline infrared (IR) detector structure, the method comprising:
   providing an amorphous template; and
   depositing a Group III-V compound semiconductor material directly on the amorphous template at a low deposition temperature that is within a range of about 300° C. to about 400° C.,
   wherein depositing a Group III-V compound semiconductor material comprises doping the Group III-V compound semiconductor material with a dopant profile to form the polycrystalline IR detector structure having a detector semiconductor junction.

2. The method of fabricating a polycrystalline IR detector structure of claim 1, wherein the temperature range of depositing the Group III-V compound semiconductor material is about 300° C. to about 375° C., the Group III-V compound semiconductor material comprising one or more of indium, aluminum, gallium, arsenic and antimony.

3. The method of fabricating a polycrystalline IR detector structure of claim 1, wherein the temperature range of depositing the Group III-V compound semiconductor material is about 300° C. to about 350° C., and wherein the amorphous template is a semiconductor substrate having amorphous surface.

4. The method of fabricating a polycrystalline IR detector structure of claim 1, wherein the temperature range of depositing the Group III-V compound semiconductor material is about 300° C. to about 325° C., and wherein depositing a Group III-V compound semiconductor material with a dopant profile comprises:
   depositing a first Group III-V compound semiconductor material and a first dopant with a gradient of different dopant levels;
   depositing a second Group III-V compound semiconductor material and a second dopant with a second dopant level on the doped first Group III-V compound semiconductor material; and
   depositing the first Group III-V compound semiconductor material and the second dopant with a first dopant level on the doped second Group III-V compound semiconductor material to form the dopant profile of the detector semiconductor junction.

5. The method of fabricating a polycrystalline IR detector structure of claim 1, wherein the temperature range of depositing the Group III-V compound semiconductor is about 300° C. to about 350° C., and wherein the amorphous template is an amorphous surface of a readout integrated circuit (ROIC) wafer, the deposition directly on the amorphous surface monolithically integrates the polycrystalline IR detector structure with the ROIC wafer to form pixels of a focal plane array.

6. The method of fabricating a polycrystalline IR detector structure of claim 1, wherein the polycrystalline IR detector structure has one or both of a dark current characteristic and a diode spectral response substantially comparable to single-crystalline Group III-V compound semiconductor IR detectors.

7. The method of fabricating a polycrystalline IR detector structure of claim 1, wherein the deposition of the Group III-V compound semiconductor material is performed using one of molecular beam epitaxy and metal organic chemical vapor deposition.

8. The method of fabricating a polycrystalline IR detector structure of claim 1, wherein depositing a Group III-V compound semiconductor material comprises:
    depositing a first contact layer of a first Group III-V compound semiconducting material on the amorphous template, the first contact layer being polycrystalline with a first doping level;
    depositing an absorber layer of a second Group III-V compound semiconducting material on the deposited first contact layer, the absorber layer being polycrystalline with a second doping level;
    depositing a barrier layer of a third Group III-V compound semiconducting material on the deposited absorber layer, the barrier layer being polycrystalline with a third doping level; and
    depositing a second contact layer of a fourth Group III-V compound semiconducting material on the barrier layer, the second contact layer being polycrystalline with a fourth doping level,
    wherein the doping levels form the dopant profile of the detector semiconductor junction of the polycrystalline IR detector structure.

9. The method of fabricating a polycrystalline IR detector structure of claim 8, wherein depositing the first contact layer comprises:
    depositing indium arsenide (InAs) having an $n^+$-type or $p^+$-type dopant and the first doping level, and
    grading the first doping level from the $n^+$-type or $p^+$-type doping level to a corresponding $n^-$-type or $p^-$-type doping level at a surface of the first contact layer;
    wherein depositing the absorber layer comprises depositing InAs with the corresponding $n^-$-type or $p^-$-type dopant and the second doping level on the first contact layer surface;
    wherein depositing the barrier layer comprises depositing aluminum antimonide (AlSb) on a surface of the absorber layer, the AlSb barrier layer having the third doping level and either a same or an opposite dopant type to the $n^-$-type or $p^-$-type dopant of the absorber layer; and
    wherein depositing the second contact layer comprises depositing InAs having either a same or an opposite dopant type to the $n^+$-type or $p^+$-type dopant of the first contact layer, the fourth doping level of the second contact layer being substantially similar to the first doping level of the first contact layer, the polycrystalline IR detector structure being a InAsSb mid-wave IR detector.

10. The method of fabricating a polycrystalline IR detector structure of claim 1, further comprising passivating grain boundaries of the polycrystalline IR detector with controlled pulses of a gas plasma comprising a carrier gas and hydrogen gas at a temperature maintained within a range of about 100° C. to less than 200° C. for a period of time to incorporate hydrogen atoms into the grain boundaries.

11. A method of monolithic integration of an infrared (IR) detector structure in a focal plane array, the method comprising:
    providing a readout integrated circuit (ROIC) wafer with an amorphous surface; and
    depositing Group III-V compound semiconductor materials directly on the amorphous surface of the ROIC wafer at a low temperature within a range of about 300° C. to less than 400° C. to form a polycrystalline IR detector structure having a semiconductor junction on the ROIC wafer,
    wherein the polycrystalline IR detector structure directly on the ROIC wafer forms a monolithically integrated structure to provide an IR focal plane array.

12. The method of monolithic integration of claim 11, wherein the Group III-V compound semiconductor materials of the polycrystalline IR detector structure comprises two or more of indium, aluminum, gallium, arsenic and antimony.

13. The method of monolithic integration of claim 11, wherein the Group III-V compound semiconductor materials are deposited on the amorphous surface of the ROIC wafer at a temperature within the range of about 300° C. to about 375° C.

14. The method of monolithic integration of claim 11, wherein the polycrystalline IR detector structure has one or both of a dark current characteristic and a diode spectral response substantially comparable to a single-crystalline Group III-V compound semiconductor IR detector.

15. The method of monolithic integration of claim 11, further comprising passivating grain boundaries of the formed polycrystalline IR detector structure in a controlled manner with hydrogen atoms, wherein passivating grain boundaries comprises exposing the monolithically integrated structure to controlled pulses of a gas plasma comprising a carrier gas and hydrogen gas at a temperature maintained within a range of about 100° C. to less than 200° C. for a period of time.

* * * * *